US006597999B1

(12) United States Patent
Sinha et al.

(10) Patent No.: US 6,597,999 B1
(45) Date of Patent: Jul. 22, 2003

(54) METHOD AND SYSTEM FOR REAL-TIME PREDICTION OF ZERO CROSSINGS OF FAULT CURRENTS

(75) Inventors: Gautam Sinha, Albany, NY (US); William James Premerlani, Scotia, NY (US); Vlatko Vlatkovic, Schenectady, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 09/467,139

(22) Filed: Dec. 20, 1999

(51) Int. Cl.[7] .......................... G01R 19/00; H02H 3/00

(52) U.S. Cl. ............................ 702/64; 702/58; 702/59; 361/93.2

(58) Field of Search ......................... 702/57–59, 64–65, 702/72, 79, 87–88; 361/3–4, 42, 45, 49, 93, 115, 93.2, 93.4, 96–97; 324/522, 524

(56) References Cited

U.S. PATENT DOCUMENTS 4,148,087 A * 4/1979 Phadke ........................ 361/80
4,559,491 A * 12/1985 Saha ........................... 702/59
4,642,724 A * 2/1987 Ruta ........................... 361/96
4,922,363 A 5/1990 Long et al.
5,216,621 A * 6/1993 Dickens ........................ 702/58
5,430,599 A 7/1995 Charpentier et al.
5,440,180 A 8/1995 Devault et al.
5,563,459 A 10/1996 Kurosawa et al.
5,627,415 A 5/1997 Charpentier et al.
5,638,296 A 6/1997 Johnson et al.
5,793,594 A * 8/1998 Niemira et al. ............ 361/93.2
5,854,729 A * 12/1998 Degeneft et al. .............. 361/4

* cited by examiner

*Primary Examiner*—Bryan Bui
(74) *Attorney, Agent, or Firm*—Ann M. Agosti; Patrick K. Patnode

(57) ABSTRACT

A method for predicting zero crossings of fault currents in a multi-phase power system includes sensing a fault current in each respective phase, estimating parameters of a model of each respective fault current, and independently using the estimated parameters for each respective fault current to predict a zero crossing of the respective fault current.

26 Claims, 7 Drawing Sheets

METHOD AND SYSTEM FOR REAL-TIME PREDICTION OF ZERO CROSSINGS OF FAULT CURRENTS

BACKGROUND

The invention relates generally to point on wave switching and more particularly to real-time prediction of zero crossings of fault currents for use in point on wave switching.

As described in commonly assigned Long et al., U.S. Pat. No. 4,922,363, to apply electromechanical contactors for switching currents in power systems that have available fault currents greater than the interrupting capacity of a contactor, it is necessary to protect the contactor from damage by backing it up with a series device that is sufficiently fast acting to interrupt fault currents prior to the contactor opening at all values of current above the interrupting capacity of the contactor. In control gear, back up fuses are used to provide this function. These fuses must also be capable of interrupting the maximum prospective fault current that can flow during a short circuit. In order to maintain good contactor-fuse coordination, the back up fuse must fully protect the contactor without subjecting the contactor to any time-current zones that may make the contactor vulnerable to damage. Poor contactor-fuse coordination can result if contactor tips open on a fault above their interrupting capacity before the fuse has time to clear since fuses do not have instantaneous trip characteristics. The period of time for a fuse to clear depends on the level of fault current. Optimum contactor-fuse coordination is obtained when the fuse clears a fault just before the contactor tips open. If the contactor tips open before the fuse clears the fault, an arc may continue across the open contact tips until the fuse clears. The arc (in air break contactors) introduces some additional impedance into the circuit that may delay fuse operation.

The challenges discussed in aforementioned Long et al., U.S. Pat. No. 4,922,363 that are associated with contactors are additionally present for other types of switching devices. With knowledge of zero crossings of fault current in a power system, operation of a switching device can be controlled to be at a specific point on the waveform of interest.

SUMMARY

It would therefore be desirable to have improved capabilities for predicting zero crossings of fault current in a power system.

Briefly, in accordance with one embodiment of the present invention, a method for predicting zero crossings of fault currents in multi-phase power systems includes sensing a fault current in each respective phase, estimating parameters of a model of each respective fault current, and independently using the estimated parameters for each respective fault current to predict a zero crossing (here and hereinafter meaning at least one zero crossing) of the respective fault current.

In accordance with another embodiment of the present invention, a method for predicting zero crossings of a fault current in a power system includes sensing the fault current; estimating parameters of a model of the fault current; and using the estimated parameters to predict a zero crossing of the fault current by (a) selecting an initial time interval in which a zero crossing is present, (b) identifying a portion of the interval that includes the zero crossing, (c) changing the interval to comprise the identified portion, and (d) determining whether the changed interval provides a desired resolution, and, if not, cycling through elements (b)–(d) until the changed interval provides the desired resolution.

In accordance with another embodiment of the present invention, a method for predicting zero crossings of a fault current in a power system includes sensing the fault current; estimating parameters of a model of the fault current; and using the estimated parameters to predict a zero crossing of the fault current by (a) predicting a predicted post-fault current zero crossing, (b) determining an actual post-fault current zero crossing, (c) determining a difference between the predicted and actual post fault current zero crossing, and (d) using the difference to predict an additional post-fault current zero crossing, the additional crossing occurring subsequent to the predicted crossing.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings, where like numerals represent like components, in which:

DETAILED DESCRIPTION OF THE INVENTION

Figure 1:
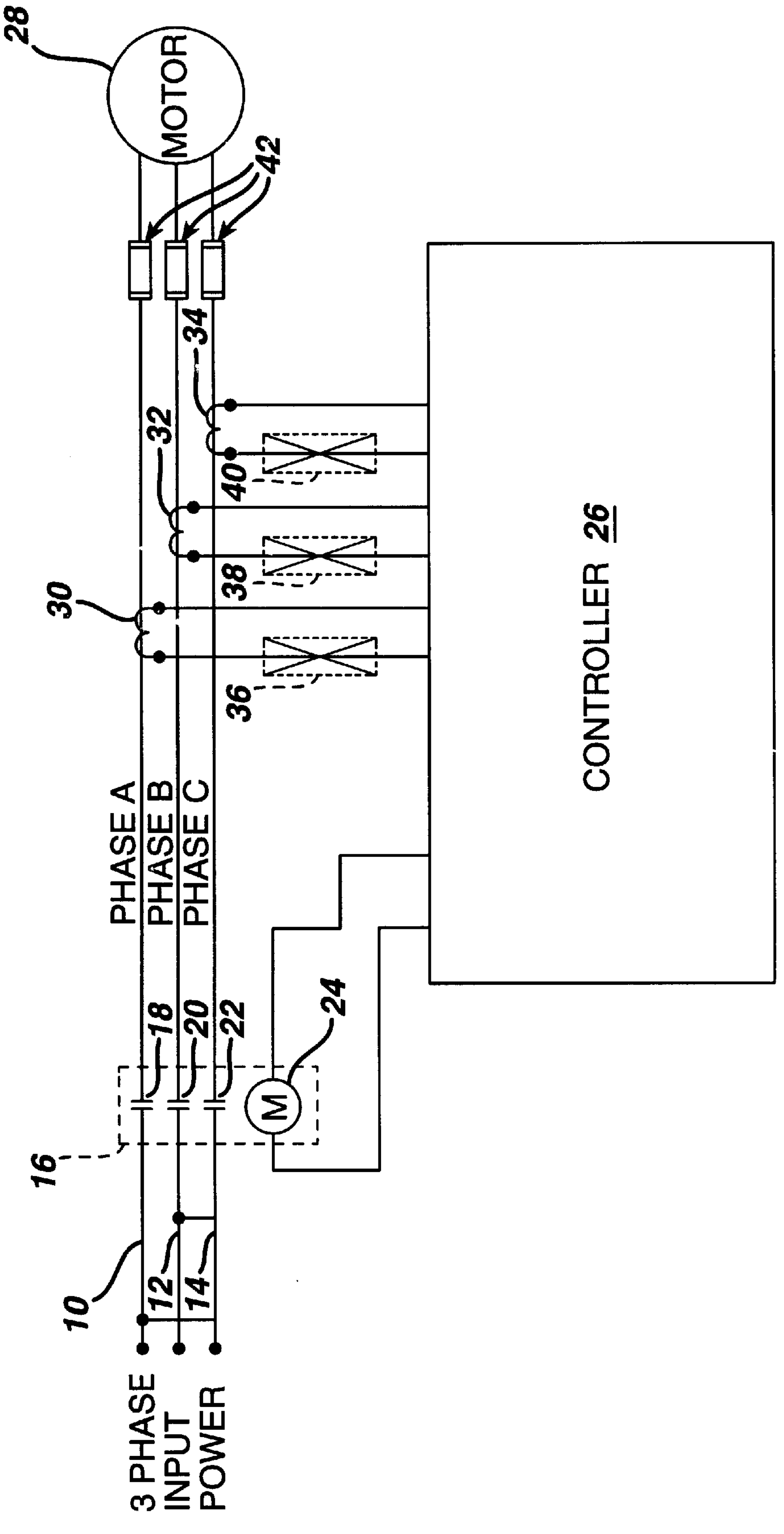
FIG. 1 PRIOR ART
FIG. 1 illustrates a conventional control system for switching devices.

FIG. 1 illustrates a conventional control system for switching devices as described in aforementioned Long et al., U.S. Pat. No. 4,922,363. Three phase alternating current is supplied via lines 10, 12, and 14 to a switching device 16 having three sets of contact tips 18, 20 and 22. Closure of the tips can effected by an actuator 34. When the tips 18, 20 and 22 are closed, current is supplied along the lines marked phase A, phase B and phase C to a load shown as an AC motor 28. Line fuses 42 are coupled between the switching device and the load. Switching device 16 may comprise a circuit breaker, circuit switch, load break switch, or re-closer, for example.

Actuator 24 is powered and controlled by switching device controller 26. Controller 26 monitors the currents in lines phase A, phase B and phase C by means of corresponding sensors 30, 32 and 34 which in one embodiment may comprise current transformers, for example. The connecting links from the sensors may include other protective relays or overcurrent devices indicated at 36, 38, and 40.

Controller 26 is a microprocessor based control and typically includes volatile memory (RAM), non-volatile memory (ROM), a central processing unit (CPU), analog to digital (A/D) converters and various interface adapter circuits. After the controller 26 receives a stop command, controller 26 selectively controls openings of contactor tips 18, 20, and 22.

Figure 2:
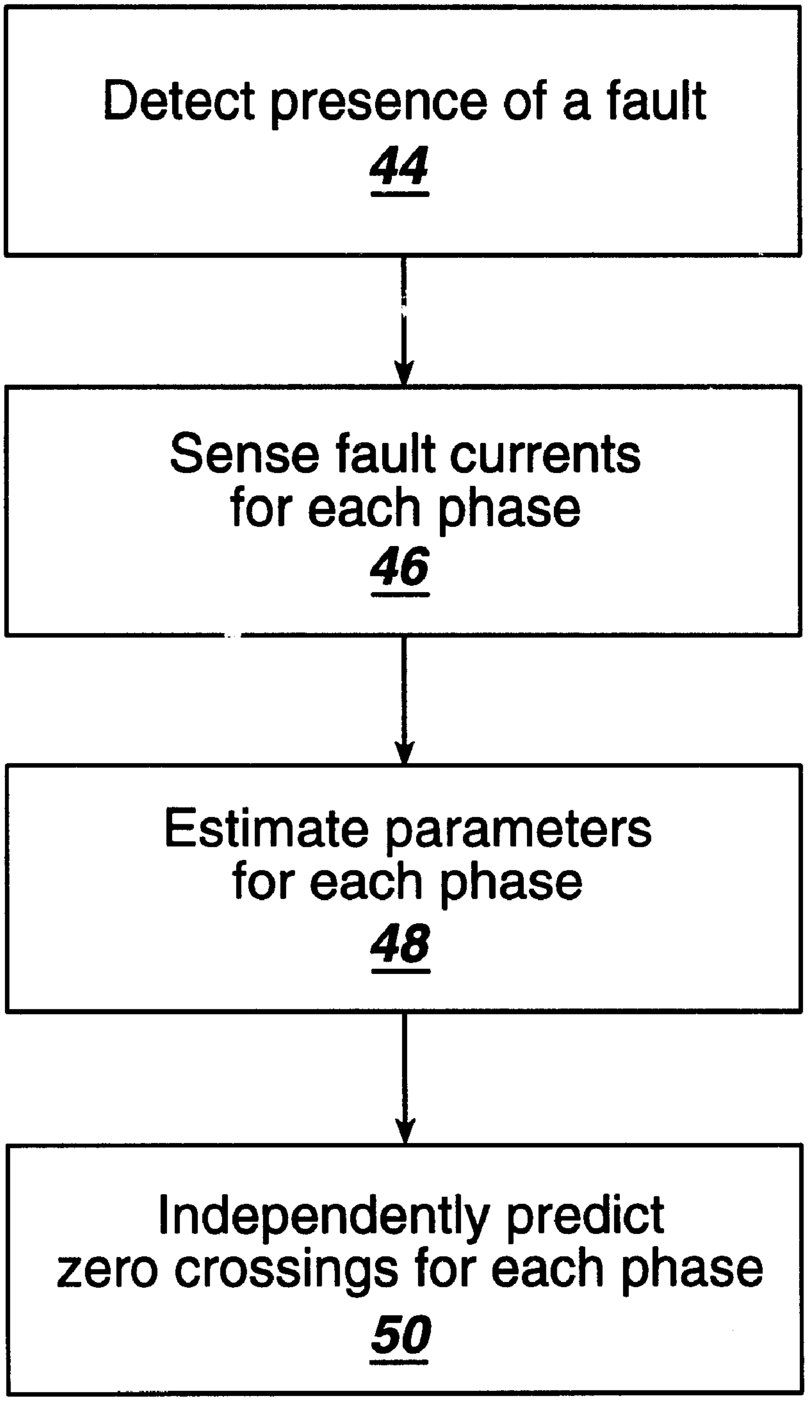
FIG. 2 is a flowchart of process steps for execution in a controller in accordance with one embodiment of the present invention.

FIG. 2 is a flowchart of process steps for execution in a controller in accordance with one embodiment of the present invention. Although the present invention is described, for purposes of example, with a three phase power system, aspects of the present invention can be additionally used on single or other multi-phase power systems.

Each of the zero-crossing prediction embodiments include the following: (a) sensing of a fault event in an application; (b) sensing the fault current in each phase; (c) estimating parameters of a model of each fault current; and (d) using the estimated parameters to predict a zero crossing of the fault current for each phase independently of the other phase calculations.

In step 44, the presence of a fault is detected. In one embodiment, the presence is detected by comparing the magnitude of each phase current with a respective predetermined range and identifying a fault if any of the phase currents falls outside of the predetermined range. Typically, if the switching device has a current rating of × amps continuous, a threshold level ranging from about 5× to about 10× amps, for example, is the threshold above which a fault is declared.

In step 46, fault currents are sensed for each phase. Analog fault currents are sensed and converted to digital signals at a sufficiently high sampling frequency. In some embodiments, the sampling frequency will be a power of 2 times the frequency of the sinusoid. For example, a 60 Hz sinusoid may have frequencies of 32×60 Hz (1920 Hz) or 64×60 (3840 Hz) or 128×60 Hz (7680 Hz).

In step 48, for each phase, the parameters of a model of the fault current are estimated. The following equation is a transcendental equation model of sampled fault current I(t) as a 50 or 60 Hz sinusoid with unknown phase angle and amplitude and with a decaying DC offset term:

$$I(t)=Ae^{(-t/\tau)}+B\cos(\omega t)+C\sin(\omega t) \tag{1}$$

wherein A represents the exponential component, B and C represent sinusoidal components, ω represents the utility grid angular frequency (377 radians/sec in North America and most of Europe, 314.2 radians/sec in England and Japan, for example), and τ represents a DC offset decay time constant.

The DC offset decay time constant is first estimated. According to one embodiment of the present invention, the estimation is performed by the following equations:

$$x(j,L)=i_{phase}(j-L+1:j), \tag{2}$$

$$X(j,m)=FFT(x,L), \tag{3a}$$

$$DC(j)=X(j,1)/L, \tag{3b}$$

$$\text{or } \mathrm{DC}(j)=\frac{1}{L}\sum_{p=j}^{j-L+1} i_{phase}(p), \text{ and} \tag{4}$$

$$\hat{\tau}(j)=\left(-\frac{T_s}{\ln\left(\frac{\mathrm{DC}(j)}{\mathrm{DC}(j-1)}\right)}\right) \tag{5}$$

wherein FFT represents a fast fourier transform, j represents a current time index, L represents the number of sample points (either of the of the FFT of equation 3a or of the window of equation 4), $i_{phase}$ represents the phase current for one phase, m represents the harmonic order of the estimate, DC(j) represents a direct current average value (that is, for example, in equation 3b a direct current value of the FFA and in equation 4 an average of the last L samples of the phase current), p represents an index, $T_S$ represents the sampling period, and ln represents the natural logarithm.

Next the initial fault current magnitude is estimated at the instant of the fault. According to one embodiment of the present invention the estimation is performed by the following equation:

$$\hat{A}(j)=\mathrm{DC}(j)e^{\frac{(j-L-1)T_s}{\hat{\tau}(j)}}. \tag{6a}$$

In an alternative embodiment, the initial fault current magnitude is estimated using recursion:

$$\hat{A}(j)=\hat{A}(j-1)*\frac{\hat{\tau}(j)}{\hat{\tau}(j-1)}*\frac{\mathrm{DC}(j)}{\mathrm{DC}(j-1)}e^{\frac{T_s}{\hat{\tau}(j)}}*\left(e^{-\frac{(L-1)*T_s}{\hat{\tau}(j)}}-1\right)\Big/\left(e^{-\frac{(L-1)*T_s}{\hat{\tau}(j-1)}}-1\right). \tag{6b}$$

This embodiment requires more complex calculations but can be less sensitive to noise in the measurement. Because DC(j) decays with time, the parameter estimations also degrade with time. Recursion improves the estimates. In both the non-recursive and recursive embodiments, the parameter estimations can be recalculated during about two to about three cycles and then held as fixed estimations.

Then phase angle θ is estimated and used to estimate the sinusoidal components B and C. In one embodiment, for example, the estimation is performed by using the first two terms of a fast fourier transform (FFT) of the measured fault current and subtracting the estimated DC offset current. For example, the following equations can be used:

$$\hat{i}_{\mathrm{DC}}(j)=\hat{A}e^{\frac{kT_s}{\hat{\tau}(j)}}, \tag{7}$$

$$\hat{i}i_{AC}(j)=i_{phase}(j)-\hat{i}_{DC}(j), \tag{8}$$

$$\theta(j)=\theta(j-1)+\omega T_s, \tag{9}$$

$$\hat{B}(j)=\frac{2\omega T_s}{\pi}\sum_{i=1}^{L}\hat{i}_{\mathrm{AC}}(j-i+1)\cos(\theta(k)), \text{ and} \tag{10}$$

$$\hat{C}(j)=\frac{2\omega T_s}{\pi}\sum_{i=1}^{L}\hat{i}_{\mathrm{AC}}(j-i+1)\sin(\theta(k)), \tag{11}$$

wherein i represents an index value.

The recursive forms of equations (10) and (11) as described in (11a), (11b) respectively can be alternately used:

$$\hat{C}(j)=\hat{C}(j-1)+\frac{2\omega T_s}{\pi}\left(\hat{i}_{\mathrm{AC}}(j)\sin(\theta(j))-\hat{i}_{\mathrm{AC}}(j-L+1)\sin(\theta(j-L+1))\right) \tag{11a}$$

-continued $$\hat{B}(j)=\hat{B}(j-1)+\frac{2\omega T_s}{\pi}\left(\hat{\imath}_{AC}(j)\cos(\theta(j))-\hat{\imath}_{AC}(j-L+1)\cos(\theta(j-L+1))\right)\quad(11b)$$

Controller 26 of FIG. 1 may comprise a digital signal processor or other type of computer, for example, and may be included in controls of an associated switching device or in a separate unit. Switching device applications will benefit from the robust implementation, and the feedback of the prediction technique will provide improved immunity to noise. Also, errors due to the presence of current harmonics and other non-idealities such as numerical sensitivity, and sampling process aliasing and quantization can be reduced by using one of the closed loop techniques that are described below.

After estimating the parameters, attempts can be made to solve equation 1 for I(t)=0 to obtain zero crossing information. However, convergence to a solution of equation 1 can be a time-consuming process. Further, solving equation 1 provides multiple solutions due to the sine and cosine terms. In preferred embodiments of the present invention, zero crossing predictions are achieved without directly solving the transcendental equation modeling the fault current.

Figure 3:
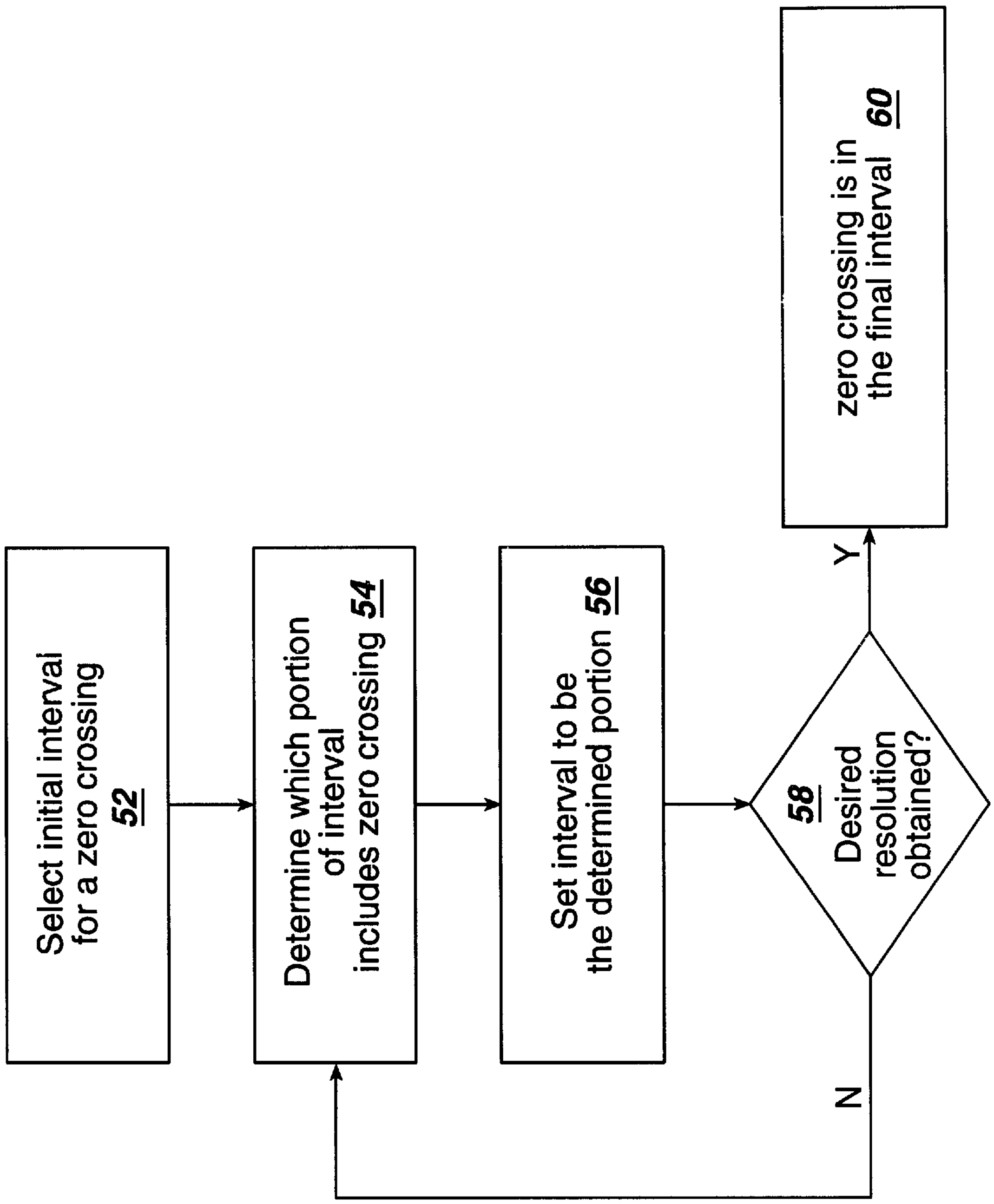
FIG. 3 is a flow chart of process steps for execution in the controller in conjunction with the process steps of FIG. 2 in accordance with a first more specific embodiment of the present invention.
Figure 4:
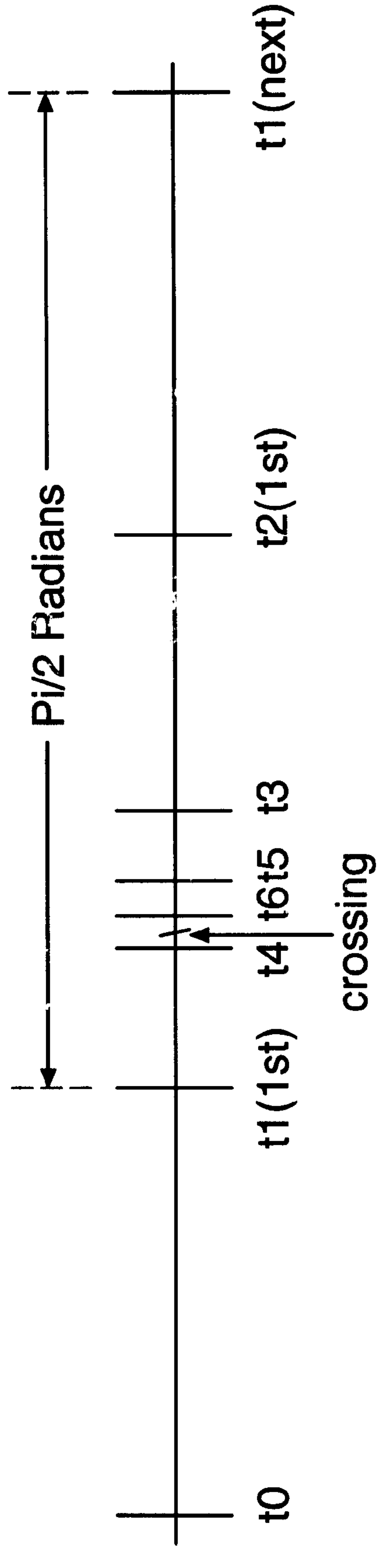
FIG. 4 is a time line for further illustrating the embodiment of FIG. 3.

FIG. 3 is a flow chart of process steps for execution in the controller in conjunction with the process steps of FIG. 2 in accordance with a first more specific embodiment of the present invention, and FIG. 4 is a time line for further illustrating the embodiment of FIG. 3. This embodiment of the invention includes an efficient method for indirectly solving, in real-time, a transcendental equation that models the behavior of a fault current and improves the reliability of switching devices such as circuit breakers by reducing arcing and has the advantage that the only sensors required are current sensors that are typically already present.

In this embodiment, zero crossings for each phase are each predicted using the estimated parameters for each respective fault current by selecting an initial time interval in which a zero crossing is present (step 52), identifying a portion of the interval that includes the zero crossing (step 54), changing the interval to comprise the identified portion (step 56), and determining whether the changed interval provides a desired resolution (step 58). If the changed interval does not, the identifying, changing, and determining are sequentially performed until the changed interval provides the desired resolution.

According to a bisection embodiment of the present invention, the sign of current I(t) is evaluated at two time points $t_1$ and $t_2$ (interval $(t_1, t_2)$). The bisection method is applicable because the fault currents change polarity at each zero crossing. The identified time points and interval between them has the property that $I(t_1)*I(t_2)<0$. In applications with a large DC offset, $t_2=t_1+\pi/\omega$ is expected to provide an interval in which the zero crossing falls.

Current I(t) is next evaluated at $t_3$ wherein $t_3$ is defined by:

$$t_3=(t_2-(t_2-t_1)/2).\quad(12)$$

That is, wherein $t_3$ is the mid-point of the original interval. Alternatively, $t_3$ can be situated anywhere within the interval, and, if desired, multiple time points between $t_1$ and $t_2$ can be used when identifying the portion of the interval with the zero crossing.

For the mid-point embodiment, the product of the signs of $I(t_3)$ and $I(t_2)$ is used to determine whether the interval of interest becomes $(t_3,t_2)$ or $(t_1,t_3)$. If $I(t_3)*I(t_2)$ is less than zero, then the interval of interest becomes $(t_3,t_2)$. Otherwise, the interval of interest becomes $(t_1,t_3)$. Alternatively, the product of $I(t_3)$ and $I(t_1)$ can be used to select the interval of interest by determining that if $I(t_3)*I(t_1)$ is less than zero, then the interval of interest becomes $(t_1,t_3)$, else the interval of interest becomes $(t_3,t_2)$.

The process of narrowing the interval is repeated iteratively with the data from the same zero crossing until the desired resolution $T_w$ is achieved and it can thus be determined that the zero crossing is within the sufficiently-narrow final interval (step 60). $T_w$ will typically be less than or equal to about 100 microseconds. For example, $t_4$ can be calculated to be the time instant half way between the selected $t_1$ and $t_3$ or $t_3$ and $t_2$ points and the currents can be calculated and multiplied to determine the next interval in the same manner as discussed above. In the example of FIG. 4, the crossing lies between $t_4$ and $t_6$.

The selection of the initial two time points $t_1$ and $t_2$ will depend on the estimations of parameters τ, A, B, and C and will be unique to each zero crossing. In one embodiment, the $t_1$ and $t_2$ time points associated with the first zero crossing of interest are estimated by first rewriting $$B\cos(\omega t)+C\sin(\omega t)\quad(13)$$

as $$D*\cos(\omega t-\phi)\quad(14)$$

wherein $$D=\sqrt{B^2+C^2}\quad(15)$$

and $$\phi=a\tan(C/B).\quad(16)$$

For most faults, the DC offset is in the range of about 10 percent to about 15 percent. Thus the zero of equation 1 will fall near to the zero of equation 14. That is, near to:

$$t=\hat{\phi}/\omega+n*\pi/2\quad(17)$$

wherein n=0(for first post-fault crossing), 1, 3, 5, 7, 9, 11, 13 . . .

For the initial first interval, $t_1$ and $t_2$ can be estimated as:

$$t_1=\hat{\phi}/\omega-\Delta,\quad(18)$$

and $$t_2=\hat{\phi}/\omega+\Delta,\quad(19)$$

wherein Δ is a number which is adjusted according to the uncertainty of the φ estimate. Higher uncertainties lead to higher Δs.

Next the currents at $t_1$ and $t_2$ are calculated as:

$$I(t_1)=Ae^{(-t1/\tau)}+D*\cos(\omega t_1-\phi),\quad(20)$$

and $$I(t_2)=Ae^{(-t2/\tau)}+D*\cos(\omega t_2-\phi)\quad(21)$$

If $I(t_1)*I(t_2)<0$, then the predicted current has crossed zero between the two time instants $t_1$and $t_2$.

The initial interval for the second zero crossing can be calculated using equation 17 as follows:

$$t_1=\hat{\phi}/\omega+\pi-\Delta,\quad(22)$$

and $$t_2=\hat{\phi}/\omega+\pi+\Delta, \quad (23)$$

Similarly, the initial interval for the third zero crossing can be calculated using equation 17 as follows:

$$t_1=\hat{\phi}/\omega+3*\pi/2-\Delta, \quad (24)$$

and $$t_2=\hat{\phi}/\omega+3\pi/2+\Delta. \quad (25)$$

The value of $\Delta$ can either remain constant (for an open loop embodiment) or change with later crossings (for a closed loop embodiment). The advantage to reducing $\Delta$ depends on the number of iterations used to get to the solution for the earlier zero crossing.

In a closed loop embodiment, depending on the magnitude of the $t_1$ and $t_2$ instants associated with subsequent zero crossings, the number of iterations can be reduced. Intervals of subsequent zero crossings can benefit from earlier data rather than using the above equations that are based on $\phi$ and $\omega$. For example, these intervals can start out in the area of a second or later iteration. The number of iterations N required to produce a prediction of a zero crossing within window $T_w$ is given by:

$$N=\ln_2((t_2-t_1)/T_w). \quad (26)$$

wherein $\ln_2$ represents a logarithm to base 2.

Once the final interval is determined, it can be assumed for all practical purposes that the zero crossing will occur in the identified interval and be within the window $T_w$. Optionally, the zero crossing could arbitrarily be declared as occurring at the midpoint of the final identified interval.

Estimates of the parameters can change over time. For improved accuracy, the parameters and $\phi$ can be recalculated. If the parameters A, $\tau$, B, and C are continuously recalculated, equation 16 can be recalculated to improve the accuracy of the $\phi$ calculation and the accuracy of the zero crossing prediction.

In another optional embodiment, a correction factor can be used to improve the selection of initial intervals for subsequent zero crossing determinations. In this embodiment, the actual zero crossing ($t_T$) is measured by the current sensors and used with its respective interval for improving the selection of a subsequent interval. For example:

$$t_1(2^{nd})=t_1(1^{st})+\pi/\omega+(t_T-(t_1(1^{st})+t_2(1^{st}))/2), \quad (26a)$$

and $$t_2(2^{nd})=t_2(1^{st})+\pi/\omega+(t_T-(t_1(1^{st})+t_2(1^{st}))/2) \quad (26b)$$

can be used for setting the initial interval for the second zero crossing. Equations 26a and 26b are useful if the actual zero crossing is within the initial interval. If the actual zero crossing was not within the initial interval, then the size of subsequent initial intervals is increased to a sufficient degree such that the actual zero crossings lie within them.

Figure 5:
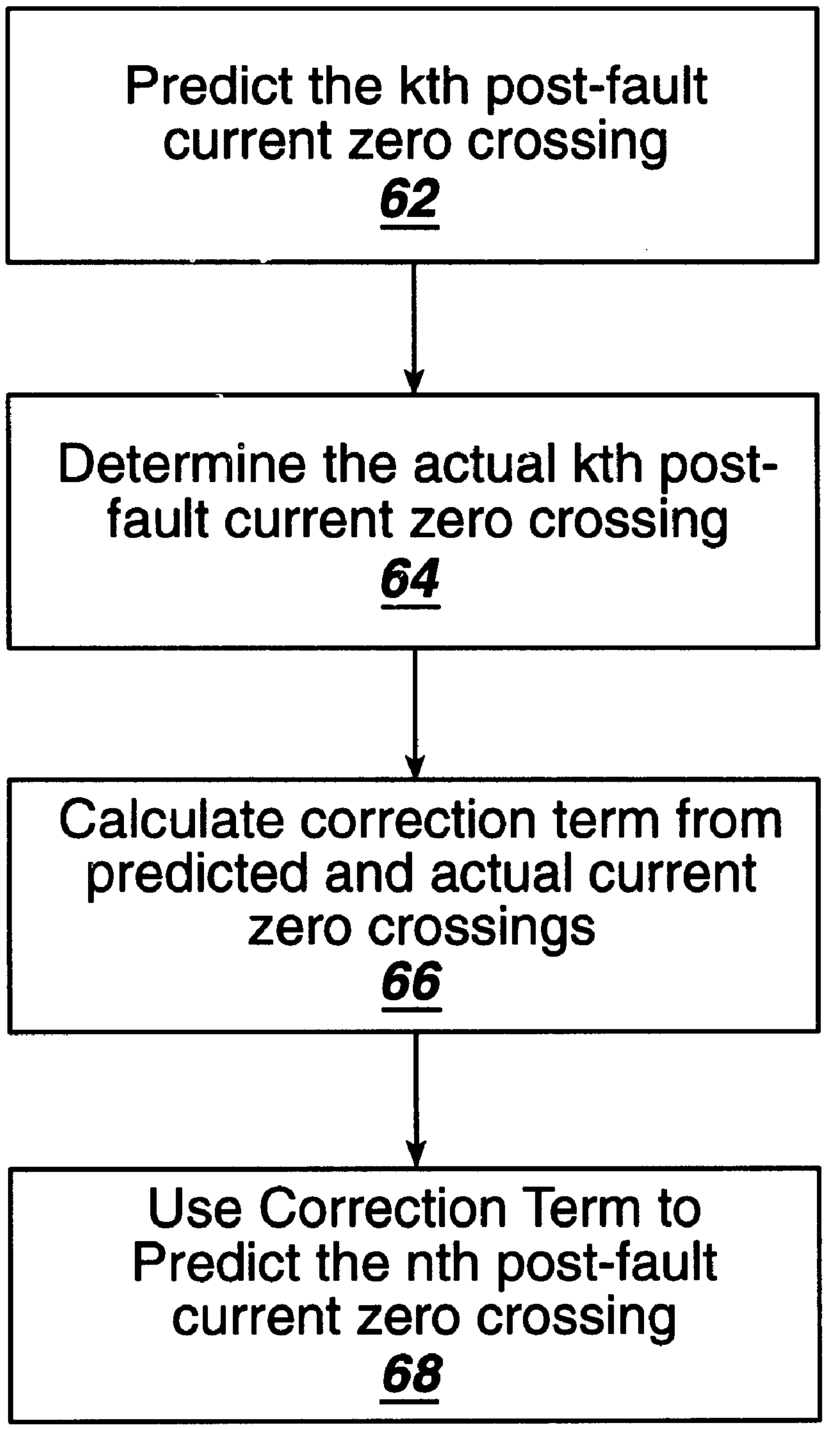
FIG. 5 is a flow chart of process steps for execution in the controller in conjunction with the process steps of FIG. 2 in accordance with a second more specific embodiment of the present invention.
Figure 6:
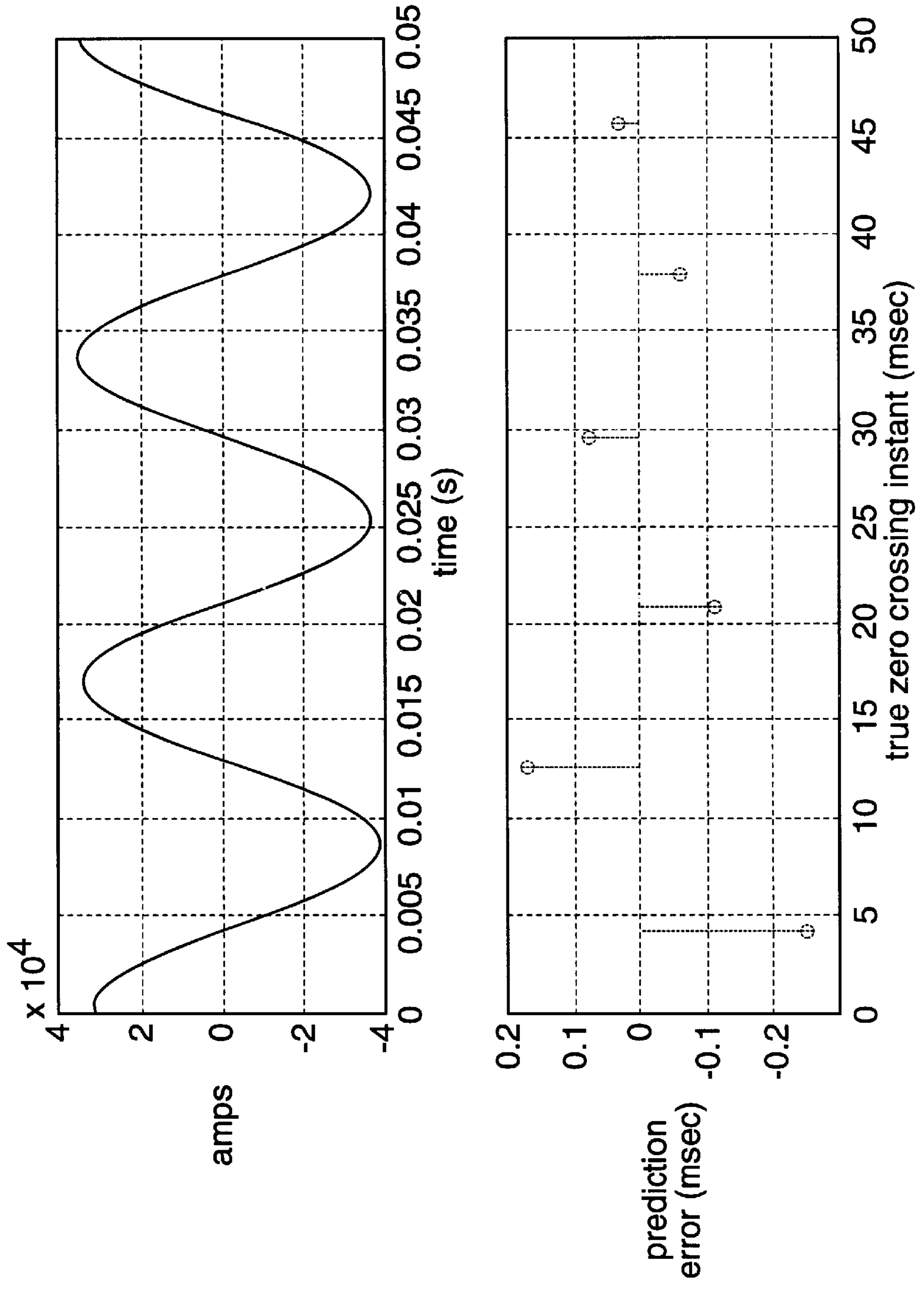
FIGS. 6 and 7 are graphs of simulation results of the embodiment of FIG. 5.
Figure 7:
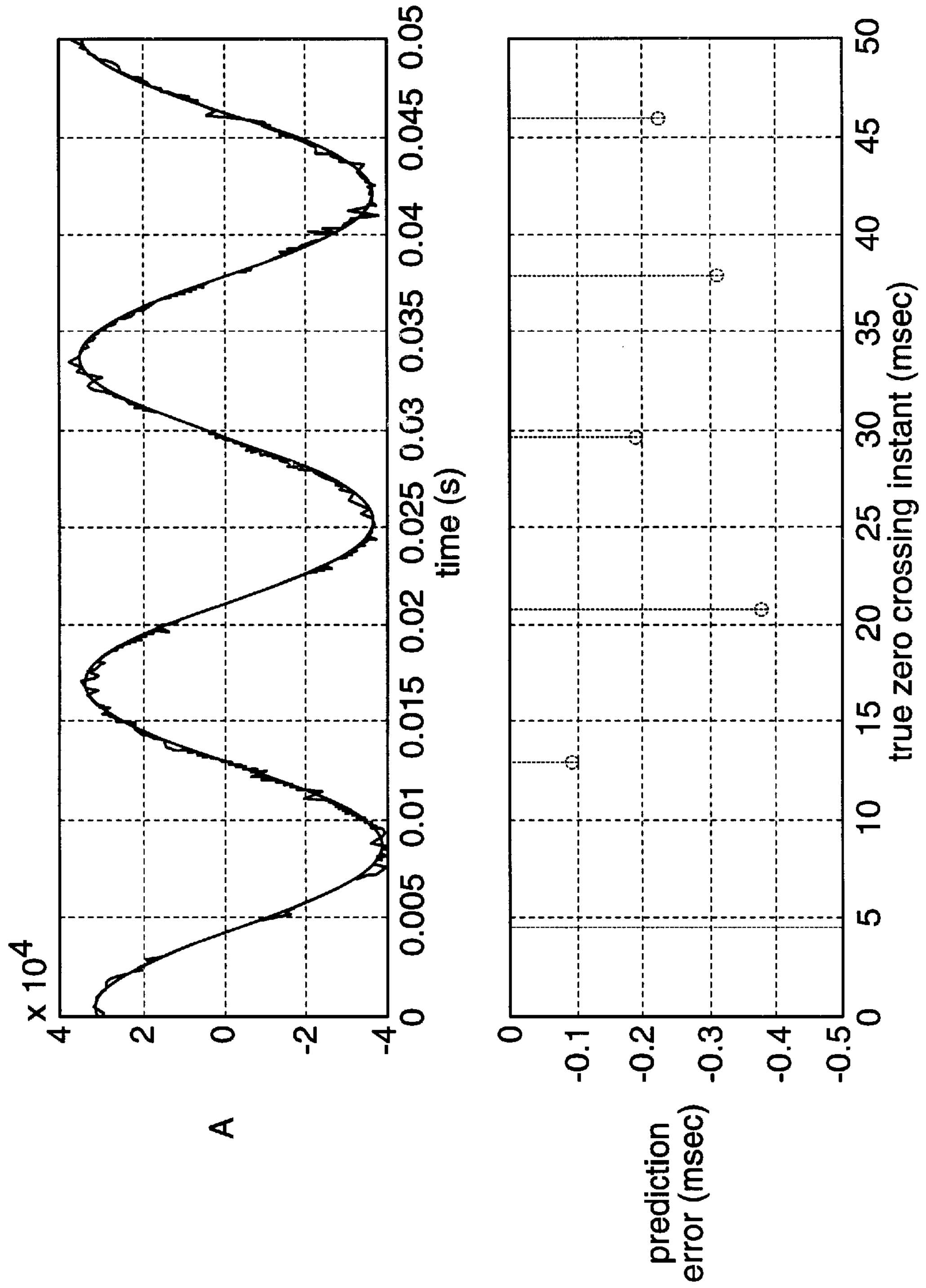

FIG. 5 is a flow chart of process steps for execution in the controller in conjunction with the process steps of FIG. 2 in accordance with a second more specific embodiment of the present invention, and FIGS. 6 and 7 are graphs of simulation results of the embodiment of FIG. 5.

In the embodiment of FIG. 5, the estimated parameters for each respective fault current is used to predict the zero crossing of the respective fault current by predicting a predicted post-fault current zero crossing (step 62), determining an actual post-fault current zero crossing (step 64), determining a difference between the predicted and actual post fault current zero crossing, and using the difference to predict an additional post-fault current zero crossing, the additional crossing occurring subsequent to the predicted crossing. More particularly, using the difference in one embodiment comprises using the difference to estimate a correction factor (step 66) and then using the correction factor to predict the additional crossing (step 68).

In the embodiment of FIG. 5, a preliminary prediction $t_{zero,n}$ of the $n^{th}$ post-fault current zero crossing can be calculated as:

$$t_{zero,n}=n\pi/\omega+a\ tan\ 2(C/B). \quad (27)$$

In distribution networks, a range of about three to about five cycles (windows) of operation is the regime of interest with each cycle including two zero crossings. In one embodiment of the present invention, at the $k^{th}$ post-fault zero crossing, the time error between the predicted and the actual $k^{th}$ zero crossing is measured. Based on this error, a correction term is added to modify the predicted $n^{th}$ zero crossing as $$t_{zero,n,new}=n\pi/\omega+a\ tan\ 2(C/B)+f(t_{zero,k,actual}-t_{zero,k,predicted}) \quad (28)$$

with the indexes n and k such that k is less than or equal to n−1. The function can be derived in any appropriate manner. Three example alternative functions are:

$$f(t_{zero,k,actual}-t_{zero,k,predicted})=t_{zero,k,actual}-t_{zero,k,predicted} \quad (29)$$

$$f(t_{zero,k,actual}-t_{zero,k,predicted})=\text{sign}(t_{zero,k,actual}-t_{zero,k,predicted})*(t_{zero,k,actual}-t_{zero,k,predicted}) \quad (30)$$

$$f(t_{zero,k,actual}-t_{zero,k,predicted})=\text{sign}((t_{zero,k,actual}-t_{zero,k,predicted})*(t_{zero,k,actual}-t_{zero,k,predicted})*abs(t_{zero,k,actual}-t_{zero,k,predicted})) \quad (31)$$

wherein sign(x)=1 if x>0 and sign(x)=−1 if x<0 and sign (0)=0 and abs represents absolute value.

Simulation results are shown in FIGS. 6–7 with FIG. 6 representing an embodiment with a signal-to-noise ratio of 240 decibels and FIG. 7 representing an embodiment with a signal-to-noise ratio of 60 decibels. For the embodiment of FIG. 6, each of the zero crossings after the first post-fault zero crossing was predicted at a value within 0.2 milliseconds of the true zero crossing. For the embodiment of FIG. 7, each of the zero crossings after the first post-fault zero crossing was predicted at a value within 0.4 milliseconds of the true zero crossing.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A method for predicting zero crossings of a fault current in a power system comprising:

sensing the fault current;

estimating parameters of a model of the fault current; and using the estimated parameters to predict a zero crossing of the fault current by (a) selecting an initial time interval in which a zero crossing is present, (b) identifying a portion of the interval that includes the zero crossing, (c) changing the interval to comprise the identified portion, and (d) determining whether the changed interval provides a desired resolution, and, if not, cycling through elements (b)-(d) until the changed interval provides the desired resolution.

2. The method of claim 1 further including determining first and second signs of the fault current at two points of an initial time interval.

3. The method of claim 2 wherein identifying a portion of the interval that includes the zero crossing includes determining at least one additional sign of the fault current for at least one point between the two points of the interval and multiplying the at least one additional sign by the first or second sign and evaluating the sign of the resulting product.

4. A method for predicting zero crossings of a fault current in a power system comprising:

sensing the fault current;

estimating parameters of a model of the fault current; and using the estimated parameters to predict a zero crossing of the fault current by (a) predicting a predicted post-fault current zero crossing, (b) determining an actual post-fault current zero crossing, (c) determining a difference between the predicted and actual post fault current zero crossing, and (d) using the difference to predict an additional post-fault current zero crossing, the additional crossing occurring subsequent to the predicted crossing.

5. The method of claim 4 wherein using the difference comprises using the difference to estimate a correction factor and then using the correction factor to predict the additional crossing.

6. A method for predicting zero crossings of fault currents in a multi-phase power system comprising:

sensing a fault current in each respective phase;

estimating parameters of a model of each respective fault current, wherein estimating the parameters of each respective fault current includes, for each respective fault current, obtaining a direct current average value (DC(j-1)) of the current at a first sampling instant, obtaining a direct current average value (DC(j)) of the current at a second sampling instant, calculating the following equation to obtain a direct current offset decay time constant ($\hat{\tau}$(j)):

$$\hat{\tau}(j)=\left(-\frac{T_s}{\ln\left(\frac{\mathrm{DC}(j)}{\mathrm{DC}(j-1)}\right)}\right)$$

wherein Ts represents a sampling frequency of the sensed fault current; and independently using the estimated parameters for each respective fault current to predict a zero crossing of the respective fault current.

7. The method of claim 6 wherein estimating the parameters of each respective fault current further includes, for each respective fault current, solving the following equation to obtain an initial fault current magnitude (Â(j)):

$$\hat{A}(j)=\mathrm{DC}(j)e^{\frac{(j-L-1)T_s}{\hat{\tau}(j)}}$$

wherein L represents a number of sample points.

8. A method for predicting zero crossings of fault currents in a multi-phase power system comprising:

sensing a fault current in each respective phase;

independently using the estimated parameters for each respective fault current to predict a zero crossing of the respective fault current, wherein independently using the estimated parameters for each respective fault current to predict the zero crossings of the respective fault current includes (a) selecting an initial time interval in which a zero crossing is present, (b) identifying a portion of the interval that includes the zero crossing, (c) changing the interval to comprise the identified portion, (d) determining whether the changed interval provides a desired resolution, and, if not, cycling through elements (b)-(d) until the changed interval provides the desired resolution.

9. The method of claim 8 further including determining first and second signs of the respective fault current at two points of an initial time interval.

10. The method of claim 9 wherein identifying a portion of the interval that includes the zero crossing includes determining at least one additional sign of the respective fault current for at least one point between the two points of the interval and multiplying the at least one additional sign by the first or second sign and evaluating the sign of the resulting product.

11. The method of claim 10 wherein the at least one additional sign comprises one additional sign and wherein the at least one point comprises a mid-point.

12. The method of claim 8 wherein the parameters include a sine component Ĉ and a cosine component B̂ and wherein selecting an initial time interval in which a zero crossing is present includes, for a first post-fault zero crossing, performing the following equations:

$$t_1=\hat{\phi}/\omega+-\Delta, \text{ and}$$

$$t_2=\hat{\phi}/\omega+\Delta,$$

wherein $\hat{\phi}$ represents an archtangent of Ĉ/B̂, ω represents an angular frequency of the fault current, and Δ represents an uncertainty factor.

13. The method of claim 12 wherein selecting an initial time interval in which a zero crossing is present includes, for a post-fault zero crossing subsequent to the first post-fault zero crossing, performing the following equations:

$$t_1=\hat{\phi}/\omega+n*\pi/2-\Delta, \text{ and}$$

$$t_2=\hat{\phi}/\omega+n*\pi/2+\Delta,$$

wherein n is an odd integer (1, 3, 5, 7, 9, . . . ).

14. The method of claim 13 wherein selecting an initial time interval in which a zero crossing is present for a post-fault zero crossing subsequent to the first post-fault zero crossing further includes recalculating $\hat{\phi}$ for the post fault zero crossing subsequent to the first post fault zero crossing.

15. The method of claim 8 wherein selecting an initial time interval in which a zero crossing is present includes, for a post-fault zero crossing subsequent to a first post-fault zero crossing, using information obtained from calculations associated with the first post-fault zero crossing.

16. A method for predicting zero crossings of fault currents in a multi-phase power system comprising:

sensing a fault current in each respective phase;

estimating parameters of a model of each respective fault current; and independently using the estimated parameters for each respective fault current to predict a zero crossing of the respective fault current wherein independently using the estimated parameters for each respective fault current to predict the zero crossings of the respective fault current includes predicting a predicted post-fault current zero crossing, determining an actual post-fault current zero crossing, determining a difference between the predicted and actual post-fault current zero crossing, the additional crossing occurring subsequent to the predicted crossing.

17. The method of claim 16 wherein using the difference comprises using the difference to estimate a correction factor and then using the correction factor to predict the additional crossing.

18. A system for predicting zero crossings of fault currents in a multi-phase power system comprising:

means for determining a fault current in each respective phase;

means for estimating parameters of a model of each respective fault current; and means for independently using the estimated parameters for each respective fault current to predict a zero crossing of the respective fault current, wherein the means for independently using the estimated parameters for each respective fault current to predict the zero crossings of the respective fault current includes (a) means for selecting an initial time interval in which a zero crossing is present, (b) means for identifying a portion of the interval that includes the zero crossing, (c) means for changing the interval to comprise the identified portion, (d) means for determining whether the changed interval provides a desired resolution, and, if not, (e) means for cycling through the functions performed by the means (b)-(d) until the changed interval provides the desired resolution.

19. A system for predicting zero crossings of fault currents in a multi-phase power system comprising:

means for determining a fault current in each respective phase;

means for estimating parameters of a model of each respective fault current; and means for independently using the estimated parameters for each respective fault current to predict a zero crossing of the respective fault current, wherein the means for independently using the estimated parameters for each respective fault current to predict the zero crossings of the respective fault current includes means for predicting a predicted post-fault current zero crossing, means for determining an actual post-fault current zero crossing, means for determining a difference between the predicted and actual post fault current zero crossing, means for using the difference to predict an additional post-fault current zero crossing, the additional crossing occurring subsequent to the predicted crossing.

20. A system for predicting zero crossings of fault currents in a multi-phase power system comprising:

means for determining a fault current in each respective phase;

means for estimating parameters of a model of each respective fault current; and means for independently using the estimated parameters for each respective fault current to predict a zero crossing of the respective fault current, wherein the controller is adapted to estimate the parameters of each respective fault current by, for each respective fault current, obtaining a direct current average value (DC(j-1)) of the current at a first sampling instant, obtaining a direct current average value (DC(j)) of the current at a second sampling instant, calculating the following equation to obtain a direct current offset decay time constant ($\hat{\tau}$(j)):

$$\hat{\tau}(j) = \left( -\frac{T_s}{\ln\left(\frac{DC(j)}{DC(j-1)}\right)} \right)$$

wherein Ts represents a sampling frequency of the sensed fault current.

21. The system of claim 20 wherein the controller is further adapted to estimate parameters of each respective fault current by, for each respective fault current, solving the following equation to obtain an initial fault current magnitude ($\hat{A}$(j)):

$$\hat{A}(j) = DC(j)e^{\frac{(j-L-1)T_s}{\hat{\tau}(j)}}$$

wherein L represents a number of sample points in one fundamental cycle of the power system.

22. A system for predicting zero crossings of fault currents in a multi-phase power system comprising:

means for determining a fault current in each respective phase;

means for estimating parameters of a model of each respective fault current; and means for independently using the estimated parameters for each respective fault current to predict a zero crossing of the respective fault current, wherein the controller is adapted to independently use the estimated parameters for each respective fault current to predict the zero crossings of the respective fault current by (a) selecting an initial time interval in which a zero crossing is present, (b) identifying a portion of the interval that includes the zero crossing, (c) changing the interval to comprise the identified portion, (d) determining whether the changed interval provides a desired resolution, and, if not, cycling through elements (b)-(d) until the changed interval provides the desired resolution.

23. The method of claim 22 wherein the parameters include a sine component $\hat{C}$ and a cosine component $\hat{B}$ and wherein the controller is adapted to select an initial time interval in which a zero crossing is present by, for a first post-fault zero crossing, performing the following equations:

$$t_1 = \hat{\phi}/\omega + -\Delta, \text{ and}$$

$$t_2 = \hat{\phi}/\omega + \Delta,$$

wherein $\hat{\phi}$ represents an archtangent of $\hat{C}/\hat{B}$, ω represents an angular frequency of the fault current, and Δ represents an uncertainty factor.

24. The system of claim 22 wherein the controller is adapted to select an initial time interval in which a zero crossing is present by, for a post-fault zero crossing subsequent to a first post-fault zero crossing, using information obtained from calculations associated with the first post-fault zero crossing.

25. A system for predicting zero crossings of fault currents in a multi-phase power system comprising:

means for determining a fault current in each respective phase;

means for estimating parameters of a model of each respective fault current; and means for independently using the estimated parameters for each respective fault current to predict a zero crossing of the respective fault current, wherein the controller is adapted to independently use the estimated parameters for each respective fault current to predict the zero crossing of the respective fault current by predicting a predicted post-fault current zero crossing, determining an actual post-fault current zero crossing, determining a difference between the predicted and actual post-fault current zero crossing, and using the difference to predict an additional post-fault current zero crossing, the additional crossing occurring subsequent to the predicted crossing.

26. The system of claim 25 wherein the computer is adapted to use the difference by using the difference to estimate a correction factor and then using the correction factor to predict the additional crossing.

* * * * *

UNITED STATES PATENT AND TRADEMARK OFFICE

CERTIFICATE OF CORRECTION

PATENT NO. : 6,597,999 B1
DATED : July 22, 2003
INVENTOR(S) : Sinha et al.

It is certified that error appears in the above-identified patent and that said Letters Patent is hereby corrected as shown below:

Column 4,
Line 46, please delete equation 8 as printed and insert --

$$\hat{i}_{AC}(j) = i_{phase}(j) - \hat{i}_{DC}(j) \qquad (8)$$ --

Column 8,
Line 32, please delete equation 30 as printed and insert --

$$f(t_{zero,k,actual} - t_{zero,k,predicted}) = -\mathrm{sign}(t_{zero,k,actual} - t_{zero,k,predicted})^* \qquad (30)$$ --

Column 11,
Line 1, delete claim 16, and insert --

16. A method for predicting zero crossings of fault currents in a multi-phase power system comprising:

sensing a fault current in each respective phase;

estimating parameters of a model of each respective fault current; and independently using the estimated parameters for each respective fault current to predict a zero crossing of the respective fault current wherein independently using the estimated parameters for each respective fault current to predict the zero crossing of the respective fault current includes predicting a predicted post-fault current zero crossing, determining an actual post-fault current zero crossing, determining a difference between the predicted and actual post fault current zero crossing, and using the difference to predict an additional post-fault current zero crossing, the additional crossing occurring subsequent to the predicted crossing. --

Signed and Sealed this

Twenty-fifth Day of May, 2004

JON W. DUDAS
*Acting Director of the United States Patent and Trademark Office*